United States Patent
Windischmann

(10) Patent No.: US 6,605,352 B1
(45) Date of Patent: Aug. 12, 2003

(54) CORROSION AND EROSION RESISTANT THIN FILM DIAMOND COATING AND APPLICATIONS THEREFOR

(75) Inventor: Henry Windischmann, Northboro, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 0 days.

(21) Appl. No.: 09/724,045

(22) Filed: Nov. 28, 2000

Related U.S. Application Data

(60) Provisional application No. 60/174,727, filed on Jan. 6, 2000.

(51) Int. Cl.⁷ .................................................. B32B 9/00
(52) U.S. Cl. ........................................ 428/408; 428/332
(58) Field of Search ........................... 423/446; 428/408, 428/332

(56) References Cited

U.S. PATENT DOCUMENTS

| | | | |
|---|---|---|---|
| 4,740,263 A | * | 4/1988 | Imai et al. |
| 5,146,481 A | * | 9/1992 | Garg et al. |
| 5,217,700 A | * | 6/1993 | Kurihara et al. |
| 5,221,411 A | * | 6/1993 | Narayan |
| 5,225,926 A | * | 7/1993 | Cuomo et al. |
| 5,370,299 A | * | 12/1994 | Tanabe et al. |
| 5,406,081 A | * | 4/1995 | Inushima |
| 5,411,797 A | * | 5/1995 | Davanloo et al. |
| 5,420,443 A | * | 5/1995 | Dreifus et al. |
| 5,427,054 A | * | 6/1995 | Saito et al. |
| 5,525,815 A | * | 6/1996 | Einset |
| 5,628,824 A | * | 5/1997 | Vohra et al. |
| 5,736,252 A | | 4/1998 | Bigelow et al. ............ 428/408 |
| 5,747,118 A | * | 5/1998 | Bunshah et al. |
| 5,851,658 A | * | 12/1998 | Yamamoto et al. |
| 5,904,778 A | | 5/1999 | Lu et al. .................. 118/723 R |
| 5,910,221 A | | 6/1999 | Wu .......................... 118/723 R |
| 5,916,370 A | | 6/1999 | Chang ......................... 118/729 |
| 6,072,275 A | * | 6/2000 | Kobashi | |

FOREIGN PATENT DOCUMENTS

| | | |
|---|---|---|
| DE | 19603093 A1 | 7/1997 |
| EP | 0635584 A1 | 1/1995 |
| EP | 0714997 A1 | 6/1996 |

OTHER PUBLICATIONS

Cooper et al "Fabrication of boron doped CVD diamond electrodes" Analytical chemistry, vol. No3. Feb. 1, 1998.*
Yagyu et al "Ion implantation in predoped CVD diamond" Thin Solid Films 281–282 (1996) p 271–274. No month.*
Abstract of Hartmann et al "Diamond growth with boron addition" International Journal of Refractory Metals & Hard Materials, vol. 16, Issue 3, 1998, pp 223–232 No month.*
Abstract of Shinar et al "Effect of boron doping on the surfaces of diamond films" Journal of Vacuum Science & Technology, May 31, 1999 pp 569–573.*

* cited by examiner

Primary Examiner—Archene Turner
(74) Attorney, Agent, or Firm—Gordon & Jacobson, P.C.

(57) ABSTRACT

A thin film diamond coating is formed relatively slowly with a relatively low methane concentration and is identified by its Raman spectrographic characteristics. The thin film diamond, preferably 5 to 40 microns thick, provides substantially greater corrosion and erosion resistance in a corrosive environment than other thin film diamond coatings. It is believed that such thin film diamond coating is provided with enhanced chemical resistance due to its purity and quality.

6 Claims, 3 Drawing Sheets

CORROSION AND EROSION RESISTANT THIN FILM DIAMOND COATING AND APPLICATIONS THEREFOR

CROSS-REFERENCE TO RELATED APPLICATIONS

This application claims the benefit of the provisional application 60/174,727 filed Jan. 6, 2000.

BACKGROUND OF THE INVENTION

1. Field of the Invention

This invention relates broadly to thin film diamond coatings. More particularly, this invention relates to the use of a thin film diamond coating as a protectant against corrosion and erosion in semiconductor processing chambers.

2. State of the Art

One step in the manufacture of semiconductor chips is processing a wafer in a semiconductor processing chamber to deposit layers on the wafer. The process of depositing layers on a semiconductor wafer substrate usually involves a chemical vapor deposition (CVD) or physical vapor deposition (PVD) process in which the wafer is placed on a graphite mandrel (which may also be designed as a susceptor for microwave or other radiation) in a thermal reactor chamber. The mandrel is typically coated with silicon carbide (SiC) to protect the graphite against corrosion. As used herein, the term "corrosion" refers to physical and/or chemical degradation. The wafer is held within a stream of a reactant gas flowing across the surface of the wafer. The thermal reactor may be heated to a high temperature by external lamps which pass infra-red radiation into the reactor chamber through heating ports. The heating ports are typically positioned both above and below the mandrel, and are covered by quartz windows which are transparent to the infra-red radiation. The mandrel positions and rotates the wafer during the deposition process, and a pyrometer aimed at the back of the mandrel is generally used to detect the temperature of the mandrel, and thereby the wafer, during processing and to serve as an input to a controller for the power to the external lamps.

During the process, the interior surfaces of the chamber and surfaces of components within the chamber are subject to coating by a deposition film. For example, during a high temperature nitride process, silicon nitride ceramic film is deposited on the walls of the chamber as well as the mandrel. As the deposition film on the chamber walls and mandrel thickens, it is prone to flaking, which introduces undesirable particulates into the chamber as well as alters the radiation emissivity of the mandrel. As the emissivity of the mandrel changes, the accuracy of a pyrometer coupled to the mandrel to monitor the temperature of the mandrel is compromised. As a result, the precision of controlling the temperature of the mandrel and consequently the precision of depositing the deposition film on the mandrel becomes limited.

Therefore, an in-situ etching process is periodically used to remove the ceramic film from the chamber walls, the mandrel, and other coated surfaces. Typically, a halogen gas or plasma, e.g., $NF_3$, is used as the etchant. It is not uncommon for portions of a protective coating on the mandrel to also be etched away during this process, and once the protective coating is removed from the surface of the mandrel, the mandrel itself is subject to corrosive attack by the etchant. Other surfaces of the system are similarly effected. Attack by the etchant affects the emissivity of the mandrel which, discussed above, reduces quality control over the semiconductor wafer. Moreover, such etching reduces the structural integrity of the etched system components.

It is known that a thick film CVD diamond, e.g., 200–300 microns thick, is an effective protective coating against both mechanical and chemical degradation. However, as a practical matter the cost of such thick diamond films prohibits their use in this application.

U.S. Pat. No. 5,916,370 to Chang discloses using relatively thin diamond films, e.g. 7–15 microns thick, to protect against corrosion and erosion in semiconductor processing chambers. However, thin diamond films are generally not nearly as effective a protective coating as are thick diamond coatings. The processing chamber corrosion is a particularly challenging problem and attacks even materials coated with the diamond film described in Chang.

Similar problems exist for materials in other environments subject to highly corrosive fluids.

SUMMARY OF THE INVENTION

In accordance with the present invention, a novel combination of a member coated with a thin film diamond coating formed by a particular process has been determined to be as effective in resisting corrosion as is a typical CVD diamond thick film. The thin film diamond coating is formed relatively slowly with a relatively low methane concentration and is identified by its Raman spectrographic characteristics. The thin film diamond, preferably 5 to 40 microns thick, has substantially similar Raman characteristics to the thick film diamond disclosed in U.S. Pat. No. 5,736,252 to Bigelow et al., which is hereby incorporated by reference herein in its entirety. While the Bigelow et al. patent identified that the thick free standing diamond film described therein had particular favorable thermal conductivity and optical transparency, it was not recognized that a thin film diamond grown in the described manner and having the resulting particular Raman spectrographic characteristics would provide substantially greater corrosion resistance in a corrosive environment and greater erosion resistance in a mechanically degrading environment than other thin film diamond coatings. It is believed that such a thin film diamond coating is provided with enhanced chemical resistance and mechanical integrity due to its purity and quality. In particular, the process minimizes grain boundaries where impurities tend to concentrate and which present an opportunity for free chemical bonds to be available at the surface. Exposed grain boundaries are therefore generally more susceptible to chemical activity and mechanical breakdown than exposed bare crystalline surfaces.

According to one embodiment of the invention, the particularly specified thin film diamond coating is coated onto exposed surfaces within a semiconductor processing chamber. The exposed surfaces of the processing chamber are thereby provided with a protective coating which resists mechanical and chemical degradation, and which is particularly resistive to chemical attack at a variety of temperatures.

According to another embodiment of the invention, in an environment in which various fluids containing corrosive environmentally harmful constituents are to be detoxified by electrolytic means, electrodes are coated with the specified diamond coating. The electrodes may be made conductive by adding to the diamond of the coating an electrical charge carrier dopant, e.g. boron, to increase its electrical conductivity. The dopant may be a donor or acceptor type.

Additional objects and advantages of the invention will become apparent to those skilled in the art upon reference to the detailed description taken in conjunction with the provided figures.

DETAILED DESCRIPTION OF THE PREFERRED EMBODIMENTS

In accord with the invention, a thin film diamond coating (that is, a diamond film coating typically having a thickness of between 5 and 150 microns (micrometers) and preferably having a thickness of less than 40 microns is provided which has the Raman spectrographic characteristics of the thick film diamond coating disclosed in U.S. Pat. No. 5,736,252, previously incorporated by reference. More particularly, the thermal conductivity matches that of free-standing thick film (i.e., is greater than 1000 W/mK), has a Raman Full Width at Half Maximum (FWHM) of less than 10 $cm^{-1}$, and preferably less than 5 $cm^{-1}$, which is an indicator of diamond coating purity and quality, and optical absorption and transparency.

Figure 1:
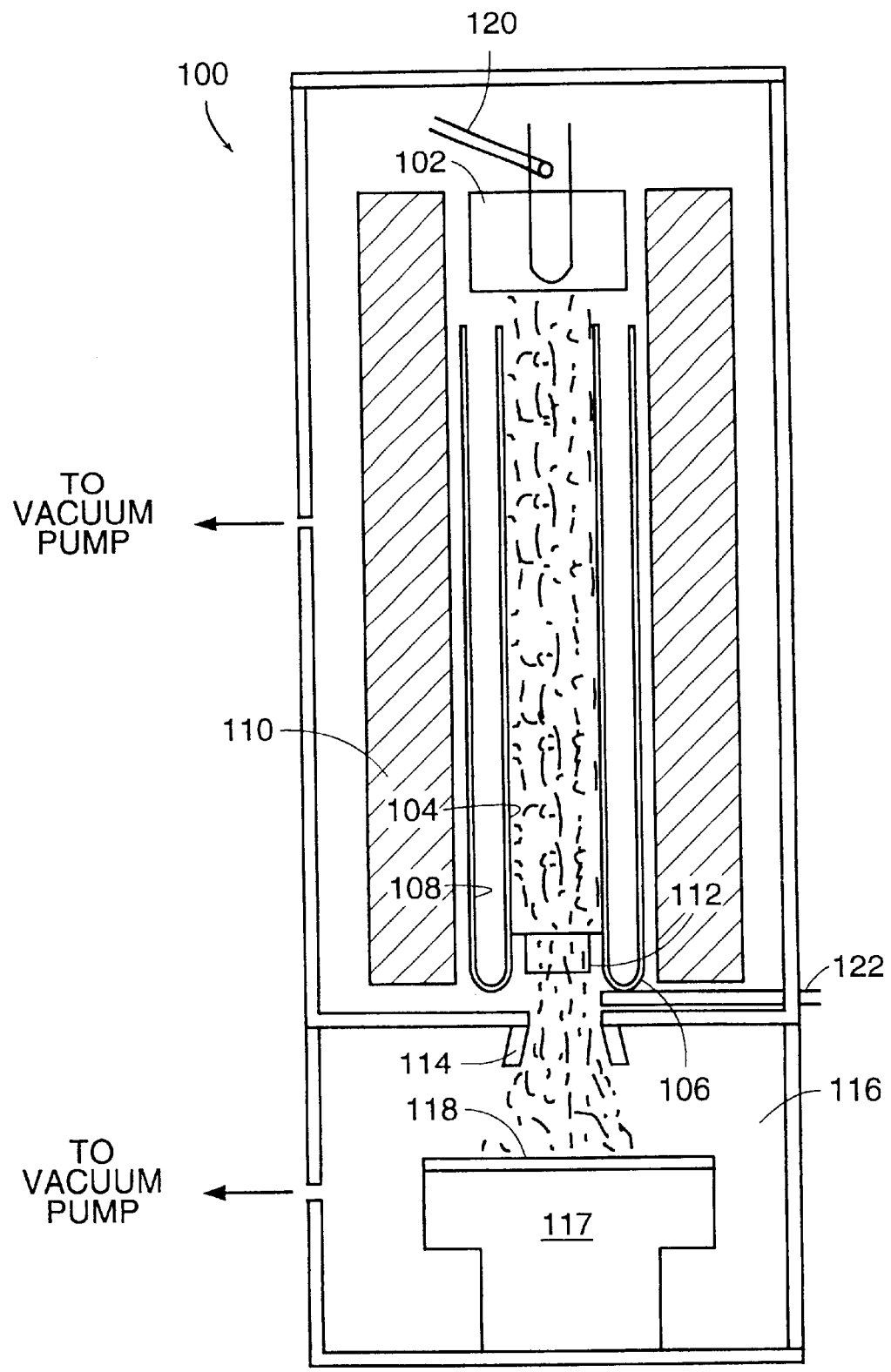
FIG. 1 is a schematic view of a chemical vapor deposition (CVD) system for coating a diamond film on a substrate.

The thin film diamond coating may be coated upon substrates and various component surfaces using a chemical vapor deposition (CVD) system, e.g., d.c. arc jet, hot wire, or microwave energy CVD system. Referring to FIG. 1, with respect to a d.c. arc jet CVD system, for example, a CVD system 100 includes a hollow, tubular cathode 102 located near the top end of a hollow barrel 104 in a metal jacket member 106. The jacket member 106 has an annular space 108 suitable for holding a fluid coolant. The barrel 104 and jacket member 106 are surrounded by a fluid-cooled magnetic coil assembly 110. Longitudinally spaced at the end of the barrel 104 opposite that of the cathode 102 is an anode 112. The anode 112 has a central opening (not shown) aligned with the axis of the barrel 104 and leading to a nozzle 114. The nozzle 114 opens into an evacuated deposition chamber 116 which has a preferably liquid-cooled mandrel 117 on which a deposition substrate 118 is spaced from the end of the nozzle 114. A first gas injection tube 120 located at the anode 112 injects gas into the central opening of the anode 112. A second gas injection tube 122 is located between the anode 112 and the nozzle 114.

In the operation of the system 100, hydrogen gas is injected through the first injection tube 120 at a predetermined rate. Between the anode 112 and the nozzle 114, more hydrogen gas, mixed with methane or another hydrocarbon, is injected through the second injection tube 122. The concentration of methane is based on the total percentage of methane injected as a volume percent of the total gas injected through both injection tubes 120, 122. A direct current arc is struck between the cathode 102 and the anode 112. The enthalpy of the gas in the barrel 104 is then adjusted by control of the arc power to result in the desired temperature of the substrate 118, which is heated by the gas impinging from the nozzle 114. At this enthalpy, the hydrogen becomes dissociated into a plasma of hydrogen atoms. The magnetic coil assembly 110 around the barrel 104 generates a solenoidal magnetic field which has the effect of swirling the arc about the anode 112 to reduce anode erosion.

The activated gas travels through the nozzle 114, enters the evacuated deposition chamber 116, and impinges on the substrate 118 to form a diamond film. As the methane enters the activated gas through the second injection tube 122, it also becomes partially dissociated into activated, unstable hydrocarbon radical species. At the substrate 118, the hydrogen acts as a facilitating gas for the deposition of the carbon atoms from the activated hydrocarbon radicals as diamond crystallites bonded to each other. The diamond crystallites consist of carbon atoms bonded chemically to each other by what is generally referred to as "sp3" bonds in a film upon the substrate 118.

The advantageous characteristics of the protective thin film diamond coating are primarily achieved by forming the diamond in a very low methane concentration environment and at a very slow rate of growth. Preferred methane concentrations are below approximately 0.07 percent, and the diamond coating is preferably deposited on a substrate kept at a temperature at or below 900° C. The diamond film is preferably grown at a rate of between 0.5 and 6.0 microns per hour to a thin film thickness of approximately 5 to 40 microns.

The particulars of CVD systems and their operation are well known in the art, and parameters other than the particular low methane concentration, e.g., enthalpy, vacuum level, and substrate temperature, are determinable by those skilled in the art without the necessity of undue experimentation.

The resulting thin film diamond is optically and infrared transparent, thermally conductive, and, most importantly, corrosion and erosion resistant. Previously, the optical transparency and thermal conductivity of thick film diamonds grown in the described manner had been recognized. However, there had been no prior recognition of the superior corrosion and erosion resistance provided by a diamond film as described herein. In addition, there had been no prior suggestion that a thin film diamond coating would have such similar favorable optical and thermal characteristics or superior corrosion and erosion resistance. It is believed that the thin film diamond coating is provided with enhanced chemical and mechanical properties due to its purity and quality. In particular, the grain boundaries which tend to concentrate impurities and present an opportunity for free surface bonds to be available, and which are therefore generally more susceptible to chemical activity and mechanical breakdown than exposed bare crystalline surfaces, are minimized.

Figure 2:
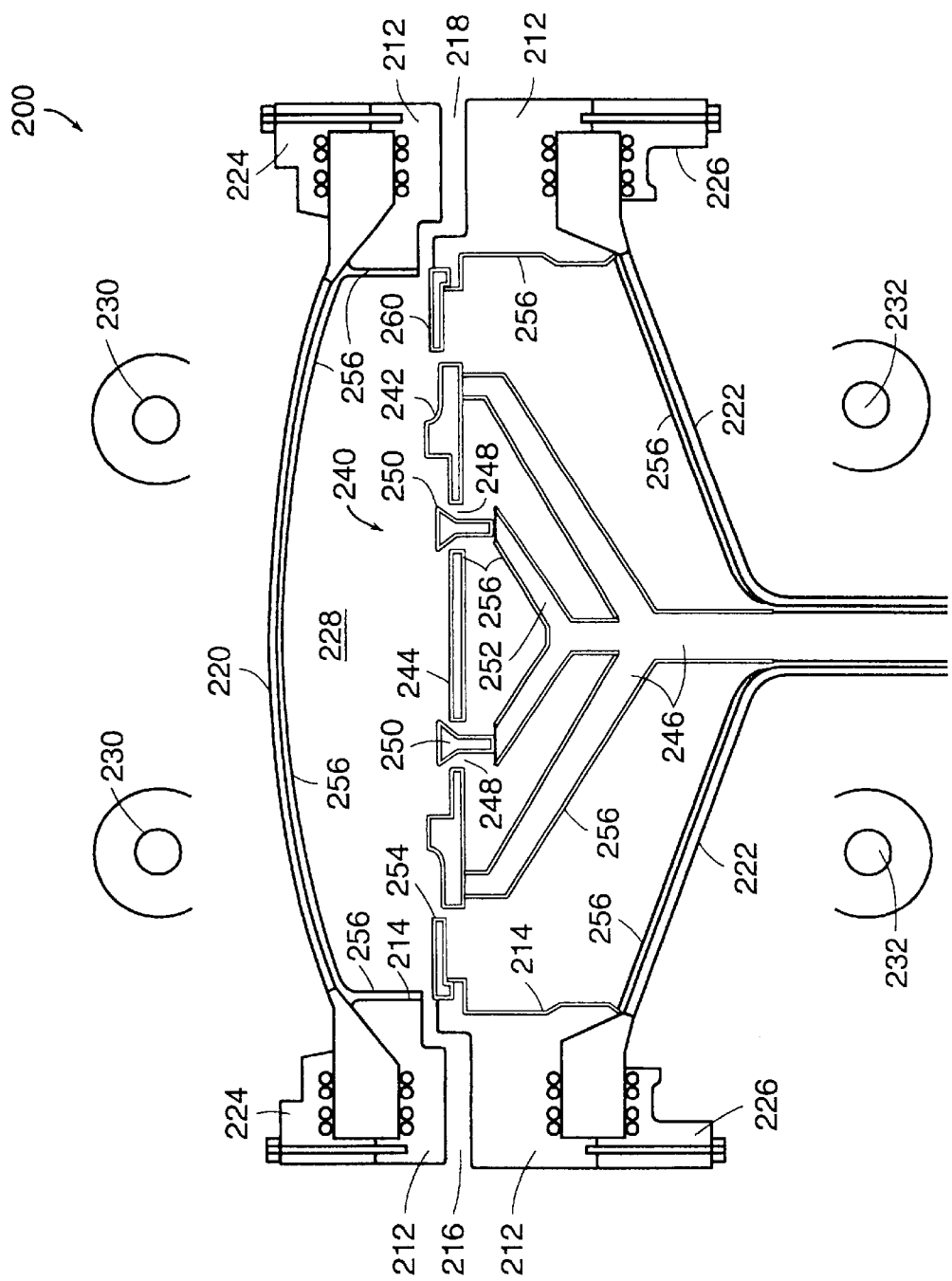
FIG. 2 is a section view of a semiconductor processing chamber coated with a protective diamond coating in accordance with a first exemplar application of the invention.

Therefore, the thin film diamond coating is suitable for use in the corrosive environment of a semiconductor wafer processing chamber. Referring to FIG. 2, a semiconductor processing chamber 200 includes a main body 212 having inner surfaces 214 and defining a gas inlet port 216 and a gas exhaust port 218. Upper and lower quartz windows 220, 222, each transparent to infrared radiation, are held about the main body 212 by an upper clamp ring 224 and a lower clamp ring 226. An inner chamber 228 is formed between the inner surfaces 214 of the main body 212 and the upper and lower quartz windows 220, 222 and facilitates the flow of a process gas over the surface of a semiconductor wafer, which is supported and positioned as described below.

Process gas is injected into the inner chamber 228 through the gas inlet port 216, which is connected to a gas source (not shown). Residual process gas and various waste products are removed from the inner chamber 228 through the exhaust port 218. Upper heating sources 230 are mounted above upper window 220 and lower heating sources 232 are mounted below lower window 222 to provide infra-red radiant heat into the inner chamber 228 through the respective upper and lower windows 220, 222.

A rotatable mandrel (or susceptor) 240 is provided within the inner chamber 228 for supporting the semiconductor wafer. The mandrel 240 includes a body 242 having a recess (seating surface) 244 or other means for retaining a wafer within the mandrel. The body 242 of mandrel 240 is preferably made of graphite; however, the body 242 may be made of other materials such as silicon carbide, silicon nitride, aluminum nitride, and other ceramics. The body 242 may also be comprised of a metal material having a protective coating.

The rotatable mandrel 240 is coupled to a mounting fixture 246 that supports the mandrel within the inner chamber 228. In this manner, a semiconductor wafer (not shown) supported on the mandrel 240 may be rotated during processing to permit a more uniform heating and deposition. Preferably, the mandrel 240 also includes a plurality of through-holes 248 for receiving at least three loading pins 250. Loading pins 250 are mounted to a support shaft 252 which provides vertical movement to raise and lower the pins 250. Such pins are used to raise a semiconductor wafer above the seating surface 244 while the wafer is being loaded or unloaded from the processing chamber.

An annular pre-heat ring 254 positioned on the main body 212 of the processing chamber encircles the mandrel 240. The pre-heat ring 254 is typically made of silicon carbide-coated graphite or quartz, depending upon the particular type of processing chamber being used.

The exposed surfaces within the processing chamber are coated with an optically transparent, thermally conductive and corrosion and erosion resistant thin film diamond coating 256. More particularly, the exposed surfaces include, but are not limited to, the inner surfaces 214 of the main body 212, the inner surfaces of the upper lower quartz windows 220, 222, the mandrel body 242, the mandrel support shaft 246, and the loading pins 250. It will be appreciated that the quartz windows 220, 222 may also be coated, since the diamond coating utilized is infrared transparent.

Therefore, when an etchant is injected into the processing chamber for purposes of wafer etching or chamber etch-cleaning, the etchant removes the undesirable buildup, yet is unable to penetrate the thin film diamond coating on the surfaces of the components of the processing chamber and expose the underlying component material. As such, the processing chamber retains its integrity.

Figure 3:
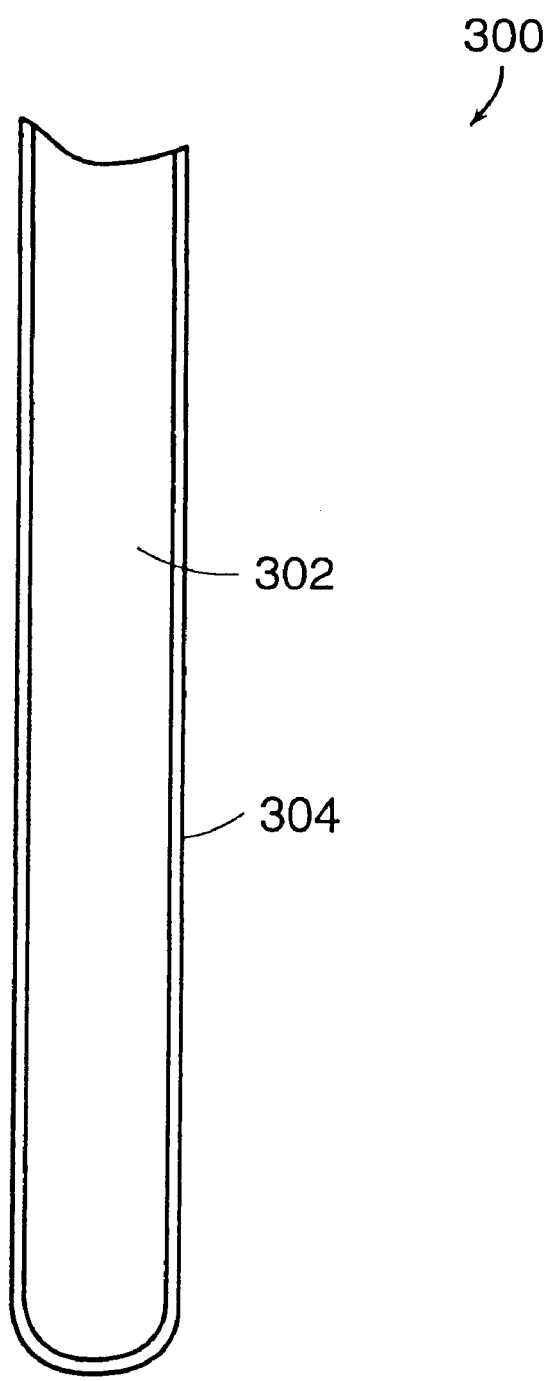
FIG. 3 is a section view of an electrode coated with the protective diamond coating in accordance with a second exemplar application of the invention.

The thin film diamond coating may additionally be used in other environments, particularly in highly corrosive environments. For example, referring to FIG. 3, in an environment in which various fluids containing corrosive environmentally harmful constituents are to be detoxified by electrolytic means, the protective coating may be provided on an electrode 300. The electrode 300 includes a conductive body 302 which is provided with a thin film diamond coating 304 of the type identified above. The diamond coating 304 is made conductive by doping the diamond coating with a charge carrier donor or acceptor, e.g. boron.

There have been described and illustrated herein a protective coating, and several applications for the use thereof. While a particular embodiment of the invention has been described, it is not intended that the invention be limited thereto, as it is intended that the invention be as broad in scope as the art will allow and that the specification be read likewise. While the thin film diamond coating is preferably between 5 and 40 microns thick, it will be appreciated that the coating may be less than 5 microns, e.g., 0.5 to 5 microns, or greater than 40 microns, e.g., up to 150 microns thick. However, it is preferred that coatings no thicker than 100 microns be used, as such coatings begin to function as thick films and are therefore unduly costly to manufacture and may suffer a reduction in their adhesion to the underlaying surface. In addition, while the methane concentration and substrate deposition temperature have been considered a key parameter, it is understood that other hydrocarbons may be substituted for methane and, when a substitute is used, its concentration is likewise kept within the same concentration limit as methane in terms of the resulting concentration of activated species of carbon radicals. Specifically referring to the use of the protective coating on the interior surfaces of a processing chamber, while a rotatable mandrel has been disclosed, it will be appreciated that the mandrel may be fixedly mounted. In addition, while particular surfaces of the processing chamber have been described as being provided with a diamond coating according to the invention, it will be understood that not all such surfaces and elements need be coated, and that other surfaces may likewise be coated. For example, and not by way of limitation, due to costs, it may be desirable to coat with diamond solely the mandrel or the quartz windows. Also, while it has been described to use the thin film diamond coating in a semiconductor wafer processing chamber, it will be appreciated that other deposition and etching environments may also be protectively coated in a like manner. In addition, with respect to the electrode application, it will be appreciated that other conductive elements, alloys, and composites may be used as the doping material. Furthermore, it will therefore be appreciated that the thin film diamond coating described herein may be provided on other articles for protection in corrosive and erosive environments, such as in combustion chambers, process monitoring windows, and the like. It will therefore be appreciated by those skilled in the art that yet other modifications could be made to the provided invention without deviating from its spirit and scope as claimed.

What is claimed is:

1. A protective coating for use on a surface of an article in a corrosive environment, consisting of:
   a polycrystalline diamond film material made by chemical vapor deposition having a thermal conductivity greater than 1000 W/mK and a Raman Full Width at Half Maximum of less than 10 cm$^{-1}$, said diamond film material having a thickness not greater than 150 microns.

2. A protective coating according to claim 1, wherein:
   said diamond film material has a thickness between 5 and 40 microns.

3. A protective coating according to claim 1, wherein:
   said diamond film material is transparent to infrared radiation.

4. A protective coating according to claim 1, wherein:
   said diamond film material has a Raman Full Width at Half Maximum of less than 5 cm$^{-1}$.

5. A protective coating according to claim 1, further comprising:
   a dopant added to said polycrystalline diamond film material to increase its electrical conductivity.

6. A protective coating according to claim 5, wherein:
   said dopant is boron.

* * * * *